United States Patent
Kukla et al.

(10) Patent No.: US 7,269,149 B2
(45) Date of Patent: Sep. 11, 2007

(54) INTERLEAVING FOR MOBILE COMMUNICATIONS

(75) Inventors: Ralf Kukla, Herddsberg (DE); Gerd Morsberger, Bubenreuth (DE); Georg Sporlein, Hirschaid (DE); Gerhard Goedert, Eschborn-Niederhöchstadt (DE); Edmund Goetz, Effeltrich (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 99 days.

(21) Appl. No.: 10/528,604

(22) PCT Filed: Sep. 24, 2002

(86) PCT No.: PCT/EP02/10670

§ 371 (c)(1),
(2), (4) Date: Dec. 7, 2005

(87) PCT Pub. No.: WO2004/030262

PCT Pub. Date: Apr. 8, 2004

(65) Prior Publication Data

US 2006/0140142 A1    Jun. 29, 2006

(51) Int. Cl.
*H04Q 7/00* (2006.01)
(52) U.S. Cl. .................. 370/328; 370/335; 370/342; 375/260; 375/267; 341/81
(58) Field of Classification Search ........... 320/328, 320/349, 315, 335, 342, 441, 337, 208, 252, 320/206, 203, 210; 325/299; 379/267, 260, 379/147, 299, 341; 341/81, 190; 714/701, 714/723, 746, 748–751; 712/223
See application file for complete search history.

(56) References Cited

U.S. PATENT DOCUMENTS

| | | | | |
|---|---|---|---|---|
| 2002/0054582 A1* | 5/2002 | Yano et al. | ................... | 370/335 |
| 2005/0005223 A1* | 1/2005 | Kawahara et al. | ........... | 714/755 |
| 2005/0154954 A1* | 7/2005 | Maru | ......................... | 714/746 |
| 2005/0248473 A1* | 11/2005 | Kukla et al. | ................... | 341/50 |
| 2005/0265469 A1* | 12/2005 | Aldana et al. | ............... | 375/260 |
| 2006/0002486 A1* | 1/2006 | van Nee | ..................... | 375/260 |
| 2006/0062314 A1* | 3/2006 | Palin et al. | ................. | 375/260 |
| 2006/0156094 A1* | 7/2006 | Chen | ........................... | 714/723 |
| 2007/0038902 A1* | 2/2007 | Kawahara et al. | ........... | 714/701 |
| 2007/0038903 A1* | 2/2007 | Kawahara et al. | ........... | 714/701 |

FOREIGN PATENT DOCUMENTS

WO    WO 02 37698 A    5/2002

* cited by examiner

*Primary Examiner*—Pablo N. Tran

(57) ABSTRACT

A method for processing a bit sequence in a digital communication system, includes the steps of (a) storing the bits of said bit sequence at locations of a memory means indicated by a first interleaving scheme, (b) converting output bit positions into input bit positions according to an inverse of a second interleaving scheme, (c) reading out bits stored at locations of said memory means corresponding to said input bit positions, thereby generating an interleaved sequence which is interleaved according to said first and said second interleaving schemes, and (d) processing said interleaved sequence according to further physical processing steps. Alternatively, step (a) may include storing the bits of said input bit sequence in a memory means and step (b) may include converting output bit positions into input bit positions according to the inverse of a sequential application of a first interleaving scheme and a second interleaving scheme.

24 Claims, 6 Drawing Sheets

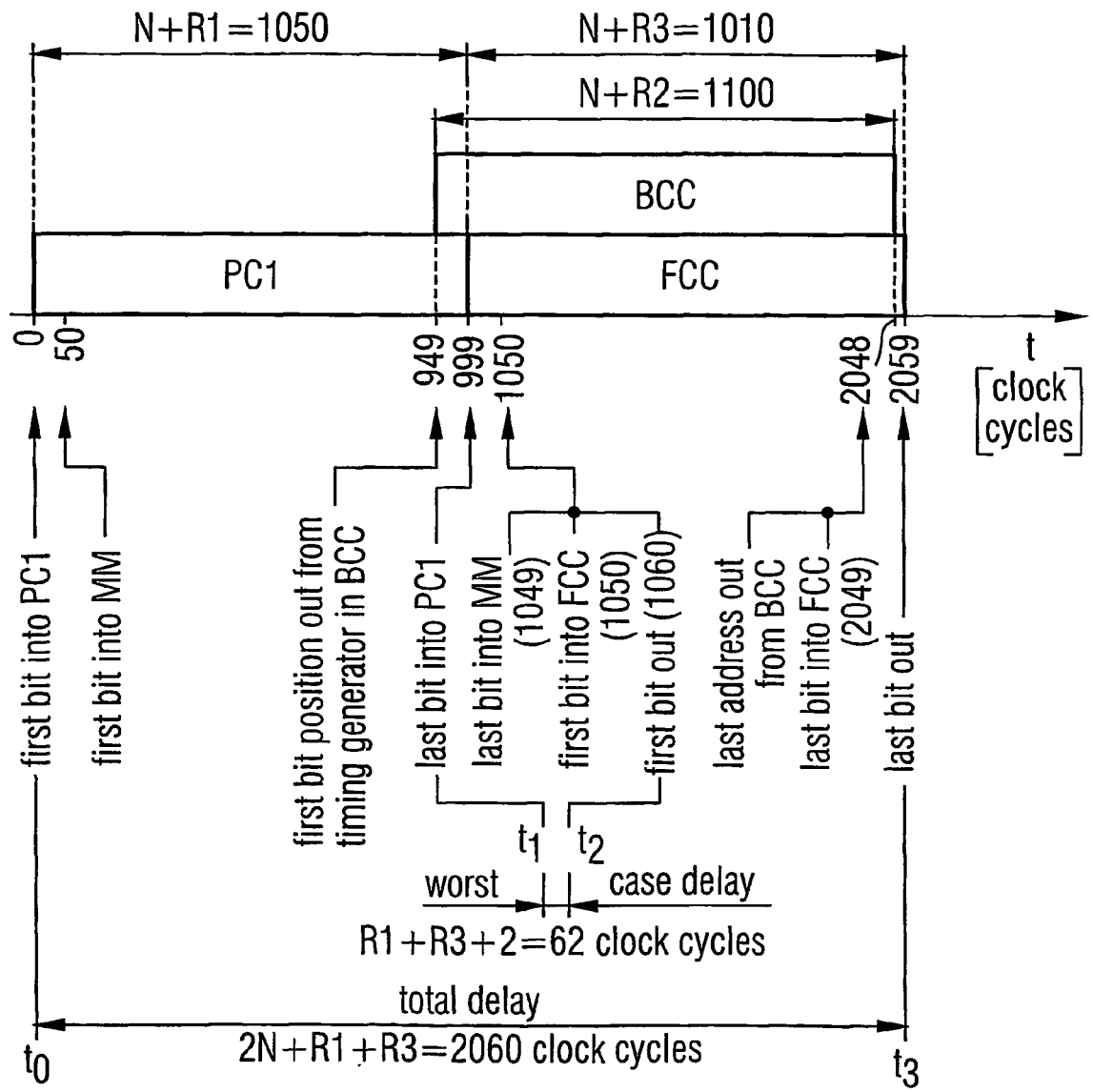

INTERLEAVING FOR MOBILE COMMUNICATIONS

FIELD OF THE INVENTION

This invention relates to methods and apparati for processing an input bit sequence in a digital communication system.

DESCRIPTION OF THE PRIOR ART

A transmitter for use in a digital telecommunication system is known, for instance, from 3GPP TS 25.212 V3.4.0 (2000-09) "3rd Generation Partnership Project; Technical Specification Group Radio Access Network; Multiplexing and channel coding (FDD) (Release 1999)", section 4.2. In FIG. 1 of the present application, a block diagram of parts of such a transmitter is given. As shown, the transmitter includes a channel encoder, a rate matcher, an interleaver, and a modulator. Further components (for frequency up-conversion, amplification etc.) are omitted for reasons of conciseness.

CHANNEL ENCODER: The channel encoder, also referred to as forward error correction (FEC) encoder, adds redundant information to each incoming data block. Thereby, the size (length) of the data block increases from K "uncoded" bits, at the encoder input, to L>K "coded" bits at its output. Herein, the size L of the coded data block depends on, at least, the number K of uncoded bits (in the uncoded data block) and a parameter r commonly referred to as the coding rate. With values in the range of 0<r<1, the coding rate r provides an indication of the degree (extent, scope) of redundancy introduced by the channel encoder: the smaller the value of r, the more redundant information is added.

The way, in which redundant information is generated, depends on the channel coding scheme employed. Typical examples are convolutional coding, concatenated convolutional coding such as "turbo" coding, and block coding.

INTERLEAVER: The purpose of the interleaver is to change the order (rearrange) of data bits inside each coded data block in order to ensure that a temporary disturbance during transmission of the data block over the physical channel does not lead to a loss of many adjacent coded data bits, since such a loss in many cases would be unrecoverable at the receiver side. A simple form of interleaving can be obtained by writing an input sequence into an interleaving matrix (memory) in a row-by-row manner and by then reading out therefrom in a column-by-column fashion (or vice-versa). For more sophisticated interleaving variants, algorithms are commonly used in order to define the changes to be performed in the order of bits.

MODULATOR etc.: Upon interleaving, the (baseband) modulator converts the interleaved data bits into symbols which, in general, are complex-valued. This may include spreading and scrambling steps. Further components, such as digital-to-analog conversion, frequency up-conversion and amplification are not shown in FIG. 1 for conciseness reasons. Finally, a signal is transmitted over the physical channel (air interface, wireline etc.).

Typically, the channel-encoding scheme, the interleaving scheme, and the modulation scheme are specified in detail by a standard according to which the telecommunication system is to be operated. For example, in third generation (3G) mobile communication standards such as WCDMA (wideband code division multiple access), two channel coding schemes are specified apart from the "no coding" case: convolutional coding and turbo coding. With these coding schemes, several coding rates are to be used ($r=\frac{1}{2}$, $r=\frac{1}{3}$, and others). Also, the uncoded data blocks supplied to the channel encoder may have different sizes K. For these reasons, 3G systems will have to support many different coded data block sizes $L\_i$, $i=1, 2, \ldots$ also referred to as different "transport channel types", wherein the block sizes may vary over a wide range (from a few bits to more than 10000 bits, e.g.). On the other hand, due to different physical channel sizes, several interleaving schemes with different interleaver sizes $Q\_j$, $j=1, 2, \ldots$ may have to be supported. For example, the WCDMA standard specifies seven different interleaver sizes in the uplink and 17 in the downlink.

In order to match the channel encoder output to a given time slot and/or frame structure, several transport channel types with different (but maybe similar) coded data block sizes $L\_i$ should use the same physical channel type (having a given size referred to as target block size in the following).

RATE MATCHER: For this to become possible, a rate matcher is typically inserted between the channel encoder and the interleaver, as shown in FIG. 1. Although it is clear from the above, that a single communication system may have to support several or even many combinations of coded data block sizes $L\_i$ and target block sizes $Q\_j$, the following generic description is based, for conciseness reasons, on a single combination of a coded data block size L and a target block size Q. In each coded data block, the rate matcher shown in FIG. 1 either repeats or deletes (removes, "punctures") a certain number of bits in order to obtain a rate-matched data block having a given target block size of Q bits (which is, e.g., the size of an interleaver or a particular block length required for transmission). For this purpose, the rate matcher has to repeat $A=Q-L$ bits of the coded data block, if L is inferior to Q, or to remove (puncture) $L-Q=-A$ bits therefrom, if L is superior to Q, so as to adapt the block size L to said target block size Q. In cases where $Q=L$, no adjustment in size is necessary, of course.

The positions inside each coded data block, where bits are to be repeated or deleted, are also specified in detail by the standard. With the knowledge of these positions, the receiver will be able to reconstruct a decoded data block from the received data block.

WCDMA BASEBAND PROCESSING: In a transmitter according to the WCDMA standard, the following 13 baseband processing steps are to be performed in the indicated order:

1. CRC attachment (CRC=cyclic redundancy check)
2. Code block padding (appending tail bits etc.)
3. Channel coding
4. Rate matching
5. First insertion of DTX indication (DTX=discontinuous transmission)
6. First Interleaving
7. Radio frame segmentation
8. TrCH multiplexing (TrCH=transport channels)
9. Second insertion of DTX indication
10. Physical channel segmentation
11. Second interleaving
12. Physical channel mapping
13. Further physical processing (spreading, scrambling, combining, baseband modulation etc.)

Herein, the major steps of channel coding (step 3), rate matching (step 4), interleaving (steps 6, 11) and further physical processing (step 13) have in principal been described above with respect to the channel encoder, the rate matcher, the interleaver, and the modulator, respectively, of FIG. 1, wherein it is important to note that interleaving is done in two separate steps 6 and 11. The further (minor)

steps relate to the attachment of CRC codes (step 1), the padding of code blocks (step 2), the insertion of DTX indications (steps 5, 9), the segmentation into radio frames (step 7), the multiplexing of transport channels (step 8), the segmentation of physical channels (step 10), and the mapping of transport channels into physical channels (step 12).

Most of the baseband processing steps mentioned above comprise instantaneous or quasi-instantaneous operations to be performed on each successive bit of the respective input bit stream. In other words, they do not need to take into account many further bits prior to and/or after an input bit under consideration, or even a complete block of input bits in order to be able to produce an output bit for said input bit(s) under consideration. For this reason, an output bit will be available some bit periods (at the limit: one bit period) after the corresponding input bit(s) has/have entered such a baseband processing step. If the following step is of the same kind, this implies that it can start to process an input bit shortly after it has been output from the preceding step (the subsequent step is said to work "in chain at its input"). There is no need for the subsequent step to wait until the preceding step has processed many bits or even a complete block of bits. For this reason, the execution periods of such baseband processing steps overlap in time. This is commonly referred to as a pipeline structure of steps (or processes).

From the 13 baseband processing steps mentioned above, these statements apply to all but the two interleaving steps 6 and 11. An interleaving step always requires storage of the entire block of input bits because, at the limit, the last output bit could be identical to the first input bit so that the first input bit needs to be "remembered" over the entire execution period of the interleaving step. Similarly, the first output bit could be identical to the very last input bit so that the last input bit must be available before the frist output bit can be generated. For these reasons, interleaving steps do not lend themselves to implement pipeline structures with the preceding and subsequent baseband processing steps.

Commonly, an interleaving step is implemented by two substeps. In a first substep, the input bits are written into a memory means in a row-by-row manner, e.g., or at locations specified by the interleaving scheme. Thereafter, in a second substep, said memory means is read out in a column-by-column manner, e.g., or at locations specified by said interleaving scheme. Although the substep of writing the input bits into said memory means can be pipelined with the preceding baseband processing steps, reading out said memory means can only begin once the complete block of input bits has been written into (and thus stored in) said memory means. The pipeline structure thus finishes with said substep of writing in. The subsequent (non-overlapping) substep of reading out the bits in their interleaved order can be considered the first step of a new pipeline structure established together with the subsequent baseband processing steps.

FIG. 2 illustrates how the 13 baseband processing steps described above can be implemented in a straightforward manner. It shows 15 processing steps (large boxes) as well as two memory means MM1 and MM2 (smaller boxes). The flow of (data) bits is indicated by solid arrows, while control signals such as addresses of memory locations are represented by dashed arrows.

The 15 processing steps can be divided into three processing "chains" PC1, PC2, and PC3. The first processing chain PC1 comprises the steps 1 to 6, i.e. from attaching a CRC code (step 1) to writing into MM1 at memory locations (addresses) as indicated by the first interleaving scheme (step 6). These steps (1-6) can be executed by a first processing unit adapted to perform said steps in a first pipeline structure; as described above. The second processing chain PC2 includes the steps 7 to 12, i.e. from reading out MM1 (step 7) to writing into MM2 at locations specified by the second interleaving scheme (step 12). These steps (7-12) can be executed by a second processing unit adapted to perform them in a second pipeline structure. The third processing chain PC3 finally comprises the steps 13 to 15, i.e. from reading out MM2 (step 13) to further physical processing (step 15), which again may be executed in a (third) pipeline structure by a (third) processing unit.

According to FIG. 2, each of the two interleaving steps is divided into two substeps, one for writing into a memory means and one for reading out therefrom. Herein, both substeps include the generation of addresses required for accessing the appropriate memory locations (dashed arrows). As the skilled person will readily appreciate, these addresses will depend on the respective interleaving scheme as well as on properties of the memory means such as the number of rows and columns in a RAM etc., the number of bits per memory location etc. In case each memory location is capable of storing several bits, the writing substep further includes the addition of other bits so as to create a word to be stored, while the reading substep further includes the selection of the desired bit from the word that has been read out.

In FIG. 2, reference to the respective interleaving scheme is made with the writing substeps only but not with the reading substeps. This is, because the writing substeps are assumed to successively write their input bits at (in general non-adjacent) memory locations as indicated by the respective interleaving scheme, while the reading substeps are assumed to successively read out the output bits from (in general adjacent) memory locations, i.e. in a "normal" (row-by-row or column-by-column, e.g.) order. Of course, other conventions such as writing in at (in general) adjacent locations and reading out from (in general) non-adjacent locations according to the respective interleaving scheme could be used just as well.

FIG. 3 provides a timing diagram for the three processing chains PC1, PC2, PC3 described above with respect to FIG. 2. In FIG. 3, each processing unit performing the steps of a particular processing chain is assumed to be capable of processing a single input bit in each cycle of a common clock signal, wherein a clock cycle may correspond to a bit period in the input bit stream. Also, each processing unit is assumed to include R=50 registers for intermediate storage and thus will delay each input bit by R=50 clock cycles. It is further assumed that a block of N=1000 (data) bits is input into the first processing unit (and thus PC1).

If the first bit is input into PC1 in the clock cycle having an index of zero (t=t0=0) and PC1 includes R=50 registers, this bit will be written from the last register of PC1 into the first memory means MM1 at t=R=50, as indicated in FIG. 3. Similarly, the j-th bit is input into PC1 at t=j−1 and written to MM1 at t=j+R−1=j+49, wherein j=2, 3, . . . , N−1=999. The last bit will be input into PC1 at t=t1=N−1=999 and written to MM1 at t=N+R−1=1049 (cf. FIG. 3). This terminates PC1 and thus the first pipeline structure including the steps 1 to 6 described above with respect to FIG. 2.

Then, from the N=1000 bits stored in MM1, the first bit is input into PC2 at t=N+R=1050 and the last bit at t=2*N+R−1=2049. As PC2 also includes R=50 registers, the first bit will be written into the second memory means MM2 at $t=N+2*R=1100$ and the last bit at $t=2*N+2*R-1=2099$. This finishes PC2 and thus the second pipeline including the steps 7 to 12 of FIG. 2.

Finally, from the $N=1000$ bits stored in MM2, the first bit is input into PC3 at $t=2*N+2*R=2100$ and the last bit at $t=3*N+2*R-1=3099$. As PC3 also includes $R=50$ registers, the first bit will be output from PC3 at $t=t2=2*N+3*R=2150$ and the last bit at $t=t3=3*N+3*R-1=3149$. This finishes PC3 and thus the third pipeline including the steps 13 to 15 of FIG. 2.

From FIG. 3, it can be seen that the total processing delay amounts to $$t_{TOTAL,1} = t3 - t0 + 1 = 3*N + 3*R = 3150 \tag{1}$$

clock cycles. The so-called "worst case delay", defined as the period between "last bit in" (into PC1) and "first bit out" (from PC3) totals to $$t_{WC,1} = t2 - t1 + 1 = N + 3*R + 2 = 1152 \tag{2}$$

clock cycles.

In summary, a straightforward implementation of the baseband processing steps according to FIGS. 2 and 3 reveals the following disadvantages:
a) the hardware complexity is rather high due to the necessity of two memory means MM1, MM2 adapted to store N bits each, wherein N denotes the number of bits in a block input into PC1;
b) the worst case delay $t_{WC,1}$ is rather high;
c) the total processing delay $t_{TOTAL,1}$ is rather high.

In view of the above, an improved baseband processing implementation should meet the following requirements:
a) it should minimize hardware complexity; in particular, the total memory size should be reduced;
b) it should minimize the worst case delay $t_{WC}$ as defined in equation (2);
c) it should minimize the total processing delay $t_{TOTAL}$ as defined in equation (1).

SUMMARY OF THE INVENTION

In view of the above, the object of the invention is to develop improved methods and apparati for processing an input bit sequence in a digital communication system.

According to one aspect of the present invention, (a) the (data) bits of said input bit sequence are written to (i.e. stored at) locations of a memory means as indicated by a first interleaving scheme, (b) output bit positions (indices) are converted back into input bit positions according to the inverse of a second interleaving scheme (assuming that said second interleaving scheme normally converts [original] input bit positions into [interleaved] output bit positions), (c) bits stored at memory locations (of said memory means) corresponding to said input bit positions are read out, thereby producing (generating) an interleaved sequence which is interleaved according to said first and said second interleaving scheme, and (d) said interleaved sequence is processed according to further physical processing steps (modulation etc.), wherein said conversion of bit positions and said processing according to further physical processing steps are performed (executed) in overlapping periods of time.

According to another aspect of the present invention, the (data) bits of said input bit sequence are written to (stored in) said memory means at locations not depending on said first interleaving scheme, and output bit positions (indices) are converted back into input bit positions according to the inverse of a sequential application of said first and said second interleaving schemes (assuming that said sequential application normally converts [original] input bit positions into [interleaved] output bit positions interleaved according to both interleaving schemes), while the other operations correspond to those described above with respect to the first aspect of the invention.

This reduces implementational complexity, since just a single memory means for storing the (data) bits is used. At the same time, this advantageously allows to reduce the total processing delay and the worst case delay.

According to another aspect of the present invention, said conversion of bit positions and said processing according to further physical processing steps is performed (executed) in essentially the same period of time.

While further reducing hardware complexity, because fewer input bit positions need to be stored according to this aspect, this allows to further reduce the total processing delay and the worst case delay.

According to another aspect of the present invention, said conversion of bit positions and said storage (writing) of (data) bits of said input bit sequence into said memory means are performed (executed) in overlapping periods of time.

This allows to reduce the total processing delay and the worst case delay to a still lower level.

According to another aspect of the present invention, bits are read out from said memory means from the earliest possible instant in time onwards after the last (data) bit of said input bit sequence has been stored in said memory means. In other words, reading out is performed just after completing the storing operations for said input bit sequence.

Thereby, both the total processing delay and the worst case delay are reduced to their minimum values.

According to another preferred embodiment, there is provided a computer program product directly loadable into the internal memory of a communication unit comprising software code portions for performing the inventive processing method when the product is run on at least one processor of the communication unit.

Therefore, the present invention is also provided to achieve an implementation of the inventive method on computer or processor systems. In conclusion, such implementation leads to the provision of computer program products for use with a computer system or more specifically at least one processor comprised in e.g., a communication unit.

DESCRIPTION OF THE DRAWINGS

Preferred embodiments of the present invention will, by way of example, be described in the sequel with reference to the following drawings.

FIG. 7: Timing diagram for the baseband processing in a WCDMA transmitter according to the present invention.

In the following description, the same reference numerals are used in order to indicate that the respective block or step has the same (or similar) functionality.

DETAILED DESCRIPTION OF THE INVENTION

Figure 4:
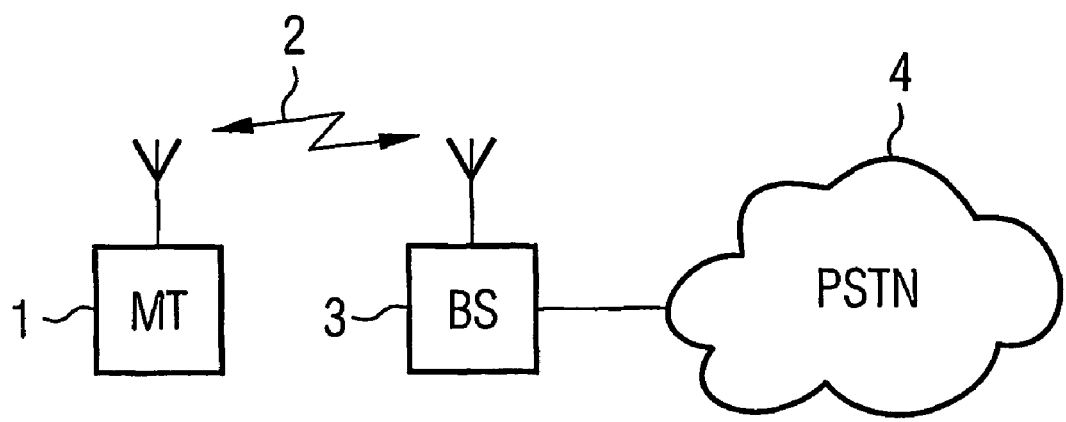
FIG. 4: Block diagram of a radio communication system according to the present invention.

FIG. 4 shows a digital radio telecommunication system according to the invention. A typical application of such a system is to connect a mobile station or mobile terminal (MT) 1 to a core network such as the public switched telephone network (PSTN) 4. For this purpose, the mobile terminal 1 is connected to a base station (BS) 3 via a radio link 2. The radio telecommunication system provides a plurality of base stations which, through other network nodes such as controllers, switches and/or gateways (not shown) are connected to the PSTN 4. Each base station typically supports, at any one time, many radio links 2 towards different mobile terminals 1.

The radio telecommunication system shown in FIG. 4 could for instance be operated according to cellular mobile communication standards such as GSM, PDC, TDMA, IS-95, WCDMA. It should however be mentioned that the invention generally applies to digital telecommunication systems no matter whether they are radio (i.e. wireless) or wireline telecommunication systems. Moreover, the invention also applies to uni-directional ("one-way") communication systems such as broadcasting systems.

Figure 5:
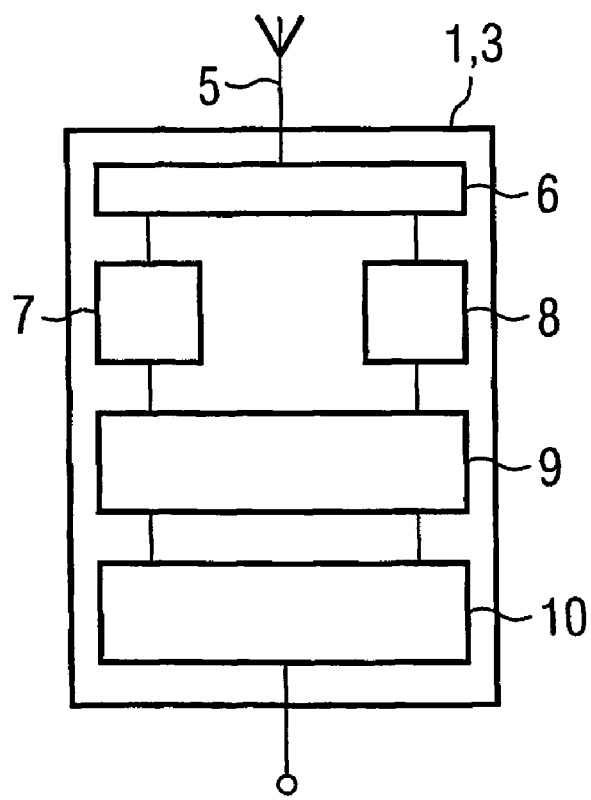
FIG. 5: Block diagram of a transceiver in a radio communication system according to the present invention.

FIG. 5 shows a block diagramme of a transceiver used in mobile terminals and base stations. Both the mobile terminal 1 and the base station 3 are equipped with one (or several) antenna(s) 5, an antenna duplex filter 6, a radio frequency receiver part 7, a radio frequency transmitter part 8, a baseband processing unit 9 and an interface 10. In case of a base station, the interface 10 is an interface towards a controller controlling the operation of the base station, while in case of a mobile terminal, the interface 10 includes a microphone, a loudspeaker, a display etc., i.e. components necessary for the user interface.

Figure 1:
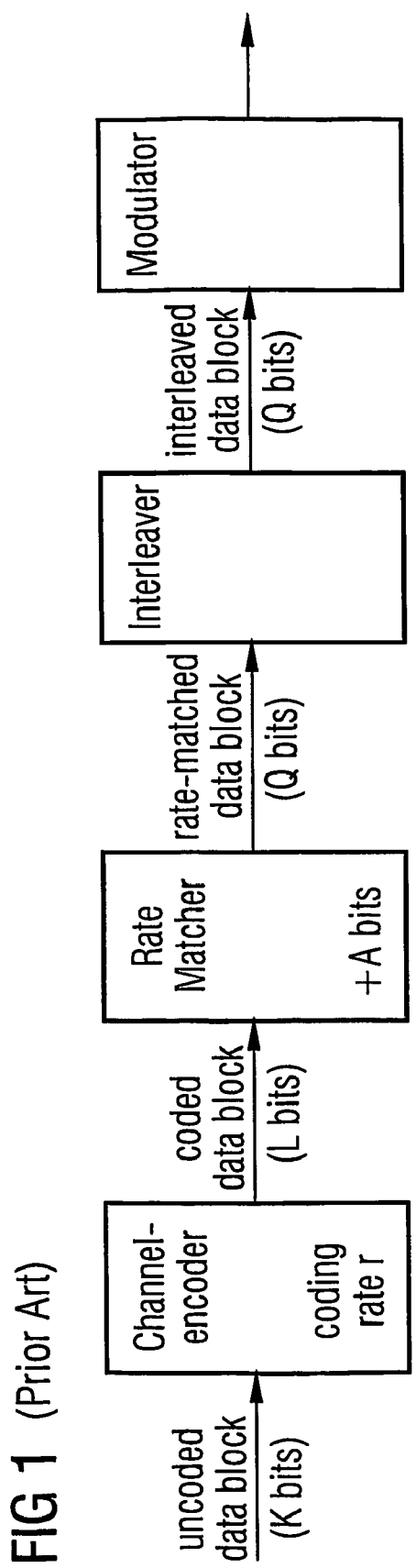
FIG. 1: Block diagram of a transmitter in a digital communication system according to the prior art.

The present invention relates to the baseband processing unit 9, parts of which have already been described above with respect to FIGS. 1 to 3. The skilled person will readily appreciate that instead of transceivers each having a common baseband processing unit for both the transmission and the reception branches, in uni-directional (broadcasting) communication systems, there are transmitters each including a first baseband processing unit for the transmission branch only and separate receivers each including a second baseband processing unit for the reception branch only. Principally, the invention applies to any such kind of baseband processing units.

The person skilled in the art will also appreciate that such baseband processing units can be implemented in different technologies such as FPGA (field programmable gate array), ASIC (application specific integrated circuit), DSP (digital signal processor) or other processor technology. In these cases, the functionality of such baseband processing units is described (and thus determined) by a computer program written in a given language such as VHDL, C or Assembler which is then converted into a file suitable for the respective technology.

The concept underlying the baseband processing approach according to the invention will be explained in the following with respect to FIGS. 6 to 7.

Figure 6:
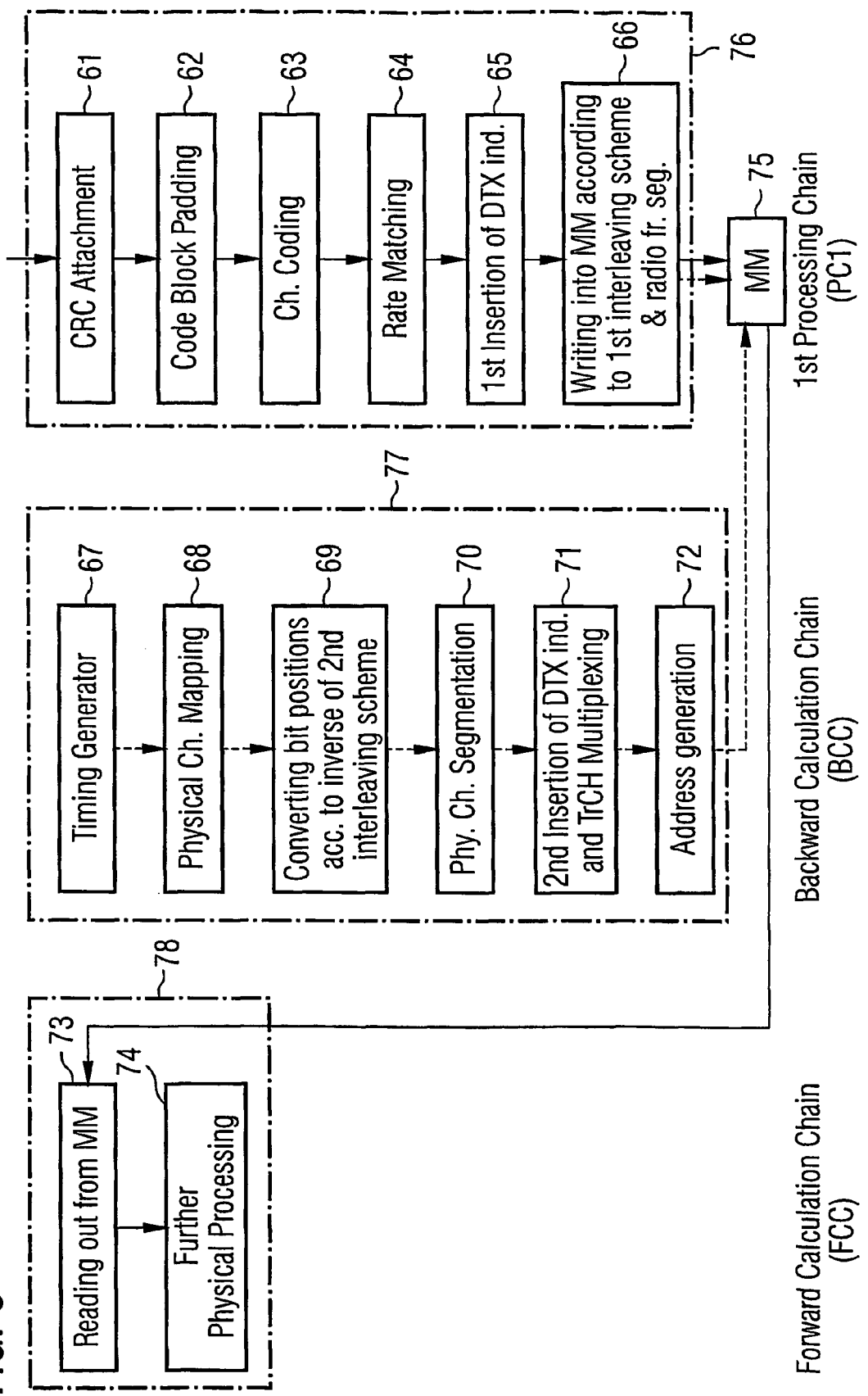
FIG. 6: Sequence of baseband processing steps performed in a WCDMA transmitter according to the present invention.

FIG. 6 illustrates how the WCDMA baseband processing steps described above with respect to the prior art can be implemented according to the present invention. It shows 14 processing steps 61-74 (large boxes) as well as a single memory means (MM) 75 (smaller box). The flow of (data) bits is indicated by solid arrows, while control signals such as bit indices, bit positions and memory addresses are represented by dashed arrows.

The 14 processing steps 61-74 are divided into three processing chains PC1, BCC, and FCC. The first processing chain PC1 comprises the steps 61-66, i.e. from attaching a CRC code (step 61) to writing into the memory means (MM, 75) at memory locations (addresses) as indicated by the first interleaving scheme (step 66). Typically, the steps 61-66 are executed in a first pipeline structure, as described above with respect to the prior art, by a first processing unit 76.

The second processing chain, referred to as "backward calculation chain" BCC includes the steps 67-72, i.e. from timing generation (step 67) to address generation (step 72). Upon timing generation (step 67) for generating output requests at the appropriate points in time, physical channel mapping is performed in step 68. Then, in step 69, output bit positions (output indices) are converted into input bit positions (input indices) in accordance with the inverse of the second interleaving scheme. Upon index conversion, physical channel segmentation takes place in step 70. Thereafter, the second insertion of DTX (discontinuous transmission) indications and TrCH (transport channel) multiplexing is performed in step 71. Finally, in step 72, memory addresses are generated from the bit positions determined in step 71 and applied to the memory means 75. Typically, the steps 67-72 are executed in a second pipeline structure by a backward processing unit 77.

The third processing chain, referred to as "forward calculation chain" FCC includes the steps 73 and 74. In step 73, the memory means (MM, 75) is read out at the memory locations having the addresses determined in step 72, thereby generating a bit sequence which is interleaved according to the first and second interleaving schemes. Then, in step 74, further physical processing (spreading, scrambling, combining, baseband modulation etc.) is performed. Typically, the steps 73-74 are executed in a third pipeline structure by a forward processing unit 78.

Comparing FIG. 6 with the straightforward baseband processing implementation described above with respect to FIG. 2, the following can be stated. The step of radio frame segmentation (previously part of PC2) has now been incorporated into step 66 of the first processing chain. Apart from this inclusion, the first processing chain PC1 of FIG. 6 corresponds to the one described above with respect to FIG. 2.

Figure 2:
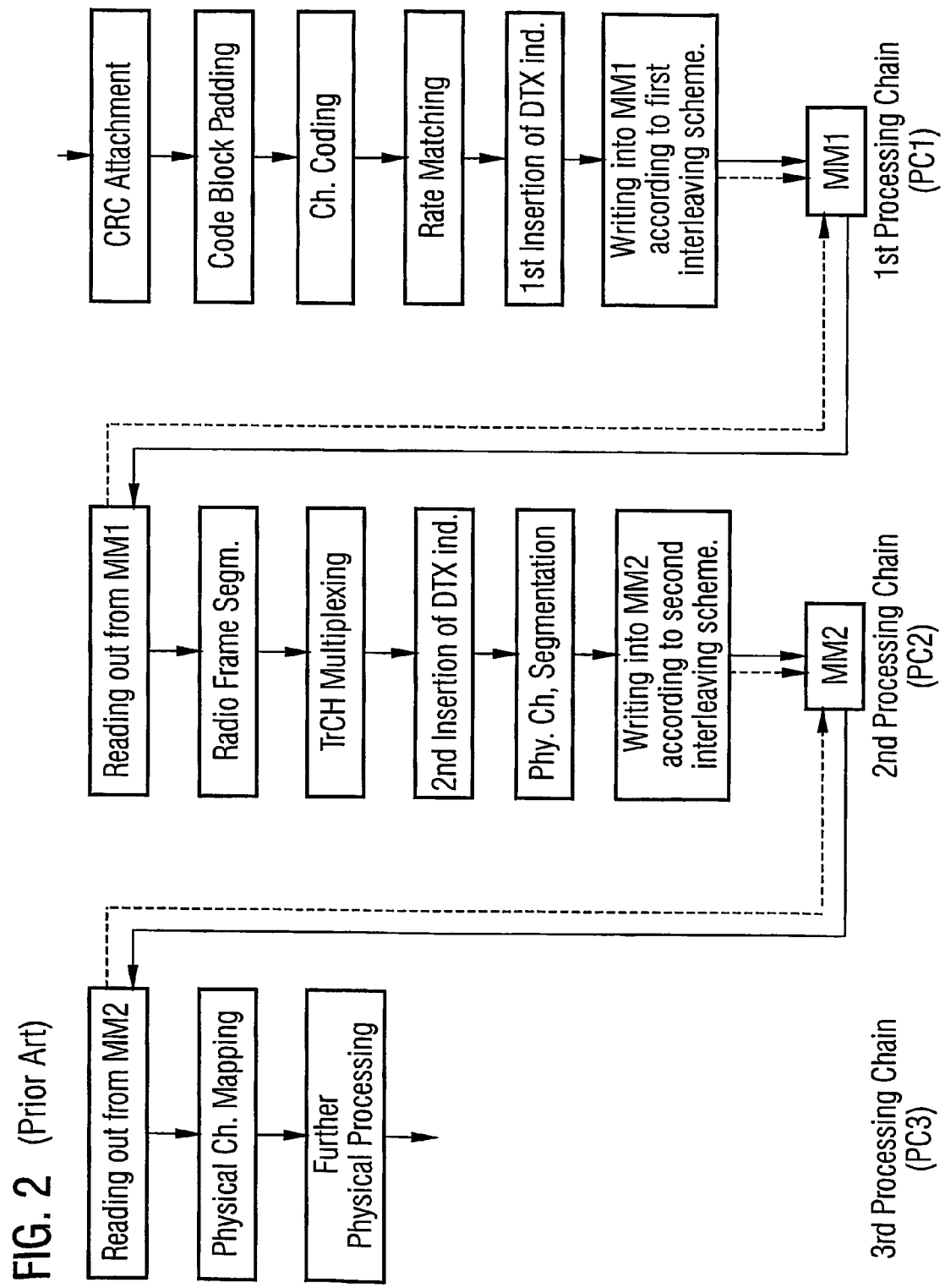
FIG. 2: Sequence of baseband processing steps performed in a WCDMA transmitter according to the prior art.

Rather than processing (data) bits, the backward processing unit 77 (corresponding to BCC) processes bit positions (indices) and generates memory addresses therefrom, as indicated in FIG. 6 by the dashed arrows linking the steps 67-72 with each other and further step 72 with the memory means 75. Also, compared with the sequence of steps in PC2 and PC3 of FIG. 2, BCC works in an inverse order (hence its name). More particularly, the sequence of (a) TrCH multiplexing, (b) $2^{nd}$ insertion of DTX indications, (c) physical channel segmentation, (d) $2^{nd}$ interleaving (writing into/reading from MM2), and (e) physical channel mapping shown in FIG. 2 is reversed into the sequence of steps 68-73 of FIG. 6, wherein the $2^{nd}$ insertion of DTX indications and TrCH multiplexing has been incorporated into a single step 71, because this reduces hardware complexity. It is important to note that not only the order of steps has been reversed but each step of BCC works in an inverse output-to-input direction rather than in the usual input-to-output direction. For example, the steps 68, 70, and 71 of BCC correspond in their functionality to the steps of FIG. 2 bearing the same names. However, in FIG. 6, they work in an output-to-input direction, and they work on bit positions (indices) rather than on the (data) bits themselves. This is, upon receipt of a desired output bit position, they are requested to deliver the corresponding input bit position (in other words, they work with output requests). In principal, this also applies to steps 69 and 72. Assuming that the second interleaving scheme assigns (interleaved) output bit positions to (original) input bit positions, step 69 of BCC converts back said output bit positions into said input bit positions according to the inverse of said second interleaving scheme. The second interleaving is thus performed in a backward direction.

According to FIG. 2, the (data) bits input into the baseband processing implementation are actually permuted according to the second interleaving scheme (i.e. interleaving operations are actually performed on said bits) in the steps of writing into and reading from MM2, i.e. between the steps of physical channel segmentation and mapping. In contrast, according to FIG. 6, between the steps of physical channel mapping (step 68) and segmentation (step 70), only indices (bit positions) are converted in step 69 (without touching said bits), while the (data) bits are actually permuted later (in step 73) according to the second interleaving scheme.

Finally, just the reading step 73 and the further physical processing step 74 remain in the third processing chain FCC of FIG. 6. Herein, according to FIG. 6, the memory means MM is accessed at the addresses determined in step 72 while in FIG. 2, the memory means MM2 is accessed in a "normal" order (row-by-row, column-by-column etc.), as described above.

In FIG. 6, the first interleaving scheme is taken into account in step 66 (by writing at memory locations in accordance with said first interleaving scheme), while the second interleaving scheme is considered in steps 69 and 73. As the skilled person will readily appreciate, both interleaving schemes could be taken into account in steps 69 and 73 only, if (in step 66) writing was performed in a "normal" order (row-by-row, column-by-column etc.) not depending on the first interleaving scheme and (in step 69) bit position conversion was performed according to the inverse of a sequential application of the first and second interleaving schemes. Assuming that said sequential application of the first and second interleaving schemes assigns output bit positions (interleaved according to both schemes) to (original) input bit positions, step 69 will in this case comprise converting back said output bit positions into said input bit positions according to the inverse of said sequential application of the first and second interleaving schemes. Therefore, both the first and the second interleaving is performed in a backward direction in this case.

FIG. 7 provides a timing diagram for the three processing chains PC1, BCC, FCC described above with respect to FIG. 6. In order to facilitate a comparison of FIGS. 7 and 3, the assumptions made for FIG. 3 largely correspond to those for FIG. 7. In particular, it is assumed that a block of N=1000 (data) bits is input into the first processing unit 76 (and thus PC1). Each processing unit (76, 77, 78) performing the steps of a particular processing chain (PC1, BCC, FCC) is assumed to be capable of processing a single input bit in each cycle of a common clock signal, wherein a clock cycle may correspond to a bit period in the input bit stream. Also, it is assumed that the first processing unit 76 includes R1=50 registers for intermediate storage and thus will delay each input bit by R1=50 clock cycles. Since the backward processing unit 77 (corresponding to BCC) of FIG. 6 has to operate on multi-bit positions (indices) rather than on single-bit (data) bits and also because BCC includes the step of physical channel mapping (step 68), the backward processing unit 77 of FIG. 6 is more complex than the corresponding unit of FIG. 2 capable of performing the steps part of PC2. Therefore, the backward processing unit 77 of FIG. 6 (capable of performing the BCC steps) is assumed to include R2=100 register stages, while the forward processing unit 78 of FIG. 6 (capable of performing the FCC steps no longer including physical channel mapping) is assumed to only comprise R3=10 registers.

Figure 3:
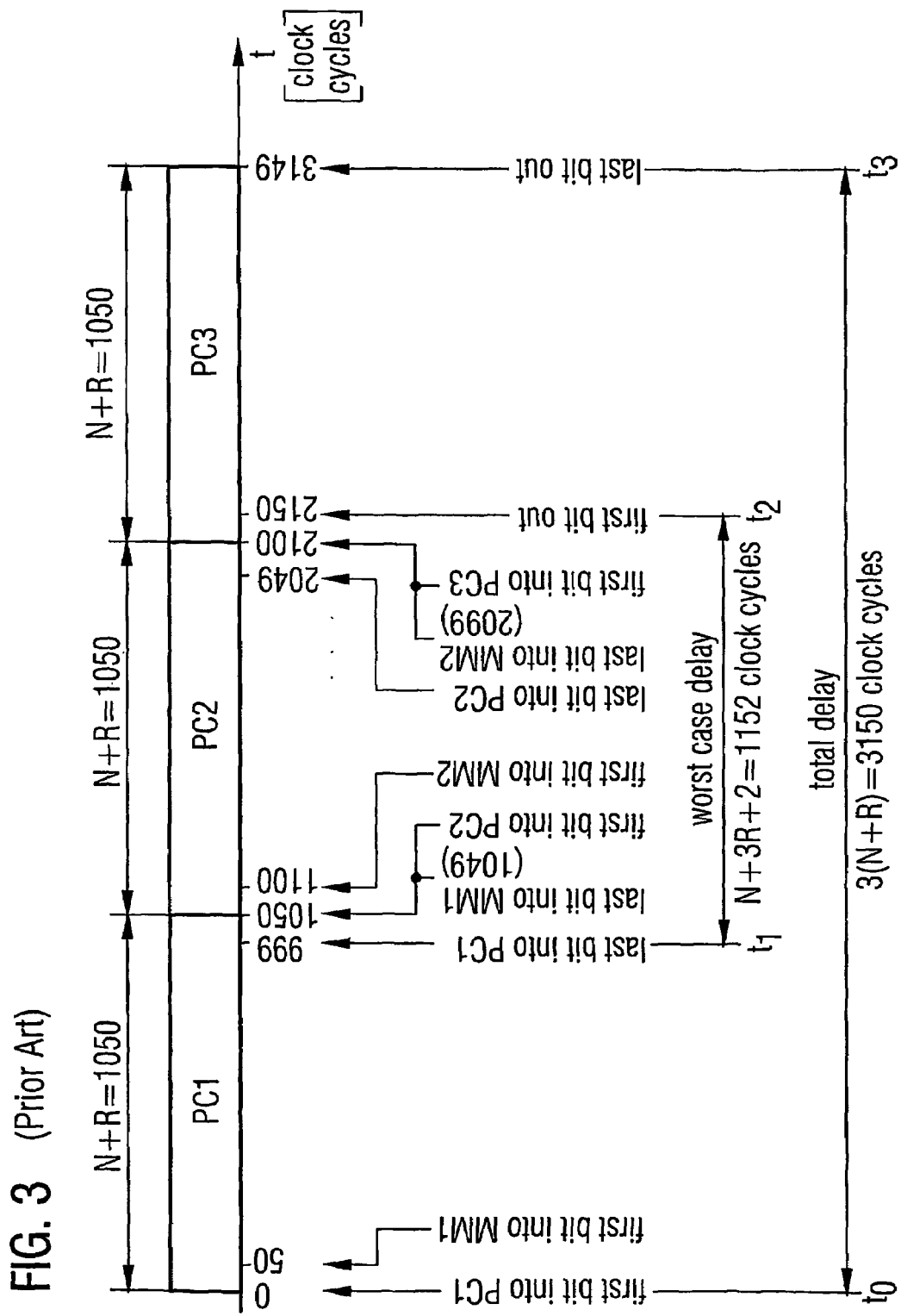
FIG. 3: Timing diagram for the baseband processing in a WCDMA transmitter according to the prior art.

As for PC1, the timing diagram in FIG. 7 corresponds to the one in FIG. 3: If the first bit is input into PC1 in the clock cycle having an index of zero (t=t0=0) and PC1 includes R1=50 registers, this bit will be written from the last register of PC1 into the memory means MM at t=R1=50, as indicated in FIG. 7. Similarly, the j-th bit is input into PC1 at t=j−1 and written into MM at t=j+R1−1=j+49, wherein j=2, 3, . . . , N−1=999. The last bit will be input into PC1 at t=t1=N−1=999 and written into MM at t=N+R1−1=1049 (cf. FIG. 7). This terminates PC1 and thus the first pipeline structure including the steps 61-66 described above with respect to FIG. 6.

On the assumption that the corresponding memory address has been determined by then (in step 72), the first bit (from the N=1000 bits stored in MM) is input into FCC at t=N+R1=1050 and the last bit at t=2*N+R1−1=2049. As FCC includes R3=10 registers, the first bit will be output from FCC at t=t2=N+R1+R3=1060 and the last bit at t=t3=2*N+R1+R3−1=2059. This finishes FCC and thus the third pipeline structure including steps 73-74 of FIG. 6.

In order to ensure that, as described above, the first bit can be input into FCC at t=N+R1=1050, the corresponding memory address must have been available one clock period earlier, i.e. at t=N+R1−1=1049. Given the assumption that BCC includes R2=100 register stages, the first bit position must have been output by the timing generator (corresponding to step 67) at t=N+R1−R2−1=949. As a consequence, the last bit position will be output by the timing generator at t=2*N+R1−R2−2=1948. Similarly, if the first address is output from BCC (step 72) at t=N+R1−1=1049, the last one will be output at t=2*N+R1−2=2048. This finishes BCC and thus the second pipeline including the steps 67-72 of FIG. 6. Therefore, the execution periods associated with BCC (and thus step 69, e.g.) and FCC (step 74, e.g.) overlap in time to a large degree, as shown in FIG. 7.

From the above description with respect to FIG. 7, it is clear that the steps of BCC and FCC can be executed in a single pipeline structure, because step 73 of FCC (see FIG. 6) does not have to wait until step 72 of BCC has output the last address, but only until the first address is output. For this reason, no memory means is required "between" BCC and FCC in FIG. 6 in contrast to FIG. 2, where we have the memory means MM2 between PC2 and PC3.

On the other hand, FCC does have to wait until step 66 of PC1 has written the last bit into the memory means 75, because there is a memory between FCC and PC1 and both FCC and PC1 process (data) bits. In contrast, although it may appear from FIG. 6 as if there were a memory between BCC and PC1 as well, BCC does not have to wait for PC1 to finish its operations, because PC1 operates on (data) bits while BCC processes bit positions (indices) and addresses.

Given the fact that BCC and FCC can be executed in a single pipeline structure, the skilled person will readily appreciate that, in addition to the first processing unit 76 of FIG. 6, a single second processing unit adapted to perform the steps of both BCC and FCC (and thus including both the backward processing unit 77 and the forward processing unit 78) will be sufficient.

From FIG. 7, it can be seen that the total processing delay amounts to $$t_{TOTAL,2} = t3 - t0 + 1 = 2*N + R1 + R3 = 2060 \quad (3)$$

clock cycles in this example. The so-called "worst case delay", defined as the period between "last bit in" (into PC1) and "first bit out" (from FCC) totals to $$t_{WC,2} = t2 - t1 + 1 = R1 + R3 + 2 = 62 \quad (4)$$

clock cycles. Dividing the values from equations (3) and (4) by those obtained from equations (1) and (2), respectively, we have $$t_{TOTAL,2}/t_{TOTAL,1} = 2060/3150 = 0.654, \quad (5)$$

$$t_{WC,2}/t_{WC,1} = 62/1152 = 0.054. \quad (6)$$

Thus, it can be stated that the total processing delay and the worst case delay have been reduced, according to the invention, to 65.4% and 5.4%, respectively, of their original values. In other words, the total processing delay $t_{TOTAL}$ has been decreased by 34.6%, while the worst case delay $t_{WC}$ has been reduced by as much as 94.6%.

Moreover, a single memory means MM having a size identical to the sizes of MM1 and MM2 of FIG. 2 is sufficient according to the invention. As the total memory size determines implementational complexity to a high degree, it can be stated that the invention reduces implementational complexity by almost 50%.

For the timing diagram shown in FIG. 7, FCC was assumed to start its operations (step 73) at the earliest possible instant in time (t=1050), i.e. directly after PC1 (step 66) has written the last bit into the memory means 75 (at t=1049). On this assumption, the total processing delay as well as the worst case delay assume their minimum values given in equations (3) and (4), respectively.

As the skilled person will appreciate, FCC can also start its operations later than that, thereby generating a gap between the end of the execution period of PC1 and the beginning of the execution period of FCC. As a consequence, the total processing delay and the worst case delay will assume values exceeding their minimum values. However, an improvement over the prior art according to FIGS. 2 and 3 will still be obtained even for rather long gaps between the execution periods of PC1 and FCC. In the example considered in FIGS. 3 and 6, an improvement in the total processing delay and the worst case delay can be obtained as long as said gap lasts for a period shorter than $$N + 3*R - R1 - R3 = 1090 \quad (7)$$

clock cycles. It is to be noted that implementational complexity does not increase due to said gap between PC1 and FCC.

With regard to the relative position of the execution periods of BCC and FCC in FIG. 7, BCC was assumed to start its operations at the latest possible instant in time which is (just) sufficient for a desired starting time of FCC (wherein, according to the assumption discussed above, said starting time is set to the earliest possible point in time (t=1050) in FIG. 7, but could also be set to a later point in time). From FIG. 7, it can be seen that BCC has to start its operations at least about R2=100 clock cycles before FCC starts its operations. As the duration of the execution period of BCC (N+R2=1100) exceeds that of FCC (N+R3=1010) by R2−R3=90 clock cycles, this results in execution periods of BCC and FCC which overlap to a large extent (see FIG. 7). Selecting this latest starting point for BCC (relative to FCC) leads to a minimum implementational complexity, because no separate memory for storing addresses is required.

As the skilled person will readily appreciate, BCC can also start its operations earlier in time relative to FCC, without any effect on the total processing delay or the worst case delay for any given position of the execution period of PC1. However, this increases implementational complexity beyond said minimum complexity because, in this case, memory addresses generated in step 72 need to be stored so as to delay memory access until FCC starts its operations with the reading step 73.

Further, from the description given above with respect to the present invention it is clear that the present invention also relates to a computer program product directly loadable into the internal memory of a digital communication unit (such as a transceiver or transmitter of a base station or a mobile phone etc.) for performing the steps of the inventive interleaving approach in case the product is run on a processor of the digital communication unit.

Therefore, this further aspect of the present invention covers the use of the inventive concepts and principles for optimised interleaving within, e.g., mobile phones and base stations adapted to future applications. The provision of the computer program products allows for easy portability of the inventive concepts and principles as well as for a flexible implementation in case of re-specifications of the interleaving scheme(s).

The foregoing description of preferred embodiments has been presented for the purpose of illustration and description. It is not intended to be exhaustive or to limit the invention to the precise form disclosed. Obvious modifications or variations are possible in the light of the above technical teachings. The embodiments have been chosen and described to provide the best illustration of the principles underlying the present invention as well as its practical application and further to enable one of ordinary skill in the art to utilize the present invention in various embodiments and with various modifications as are suited to the particular use contemplated. All such modifications and variations are within the scope of the invention as determined by the appended claims.

LIST OF ABBREVIATIONS

3G: third generation
3GPP: third generation partnership project
ASIC: Application specific integrated circuit
BCC: Backward calculation chain
BS: Base station
CRC: Cyclic redundancy check
DSP: Digital signal processor
DTX: Discontinuous transmission
ETSI: European Telecomm. Standardization Institute
FCC: Forward calculation chain
FDD: Frequency division duplex
FPGA: Field programmable gate array
GSM: Global system for mobile communications
IS-95: Interim Standard 95
MT: Mobile terminal/station
PC: Processing chain
PDC: Personal digital cellular (system)

PSTN: Public switched telephone network
RAM: Random access memory
ROM: Read-only memory
TDMA: Time division multiple access
TrCH: Transport channel
TS: Technical specification
WCDMA: Wideband code division multiple access

The invention claimed is:

1. A method for processing an input bit sequence in a digital communication system, said method including the steps of:
   a) storing the bits of said input bit sequence at locations of a memory means indicated by a first interleaving scheme,
   b) converting output bit positions into input bit positions according to an inverse of a second interleaving scheme,
   c) reading out bits stored at locations of said memory means corresponding to said input bit positions, thereby generating an interleaved sequence which is interleaved according to said first and said second interleaving schemes,
   d) processing said interleaved sequence according to further physical processing steps, wherein the execution periods of the converting and processing steps overlap in time.

2. The method according to claim 1, wherein the converting and processing steps are executed in the same period of time.

3. The method according to claim 1, wherein the execution periods of the converting and storing steps overlap in time.

4. The method according to claim 1, wherein said reading step commences operations following completion of said storing step.

5. The method according to claim 1, wherein said further physical processing steps include a step of modulation.

6. The method according to claim 1, wherein said further physical processing steps include a step of spreading.

7. A method for processing an input bit sequence in a digital communication system, said method including the steps of:
   a) storing the bits of said input bit sequence in a memory means,
   b) converting output bit positions into input bit positions according to an inverse of a sequential application of a first interleaving scheme and a second interleaving scheme,
   c) reading out bits stored at locations of said memory means corresponding to said input bit positions, thereby generating an interleaved sequence which is interleaved according to said first and said second interleaving schemes,
   d) processing said interleaved sequence according to further physical processing steps, wherein the execution periods of the converting and processing steps overlap in time.

8. The method according to claim 7, wherein execution periods of the converting and processing steps overlap in time.

9. The method according to claim 7, wherein the execution periods of the converting and storing steps overlap in time.

10. The method according to claim 7, wherein said reading step begins upon completion of said storing step.

11. The method according to claim 7, wherein said further physical processing steps further include a step of modulation.

12. The method according to claim 7, wherein said further physical processing steps further include step of spreading.

13. Apparatus for processing an input bit sequence in a digital communication system, including:
   a) a memory means capable of storing said input bit sequence,
   b) a first processing unit adapted to store the bits of said input bit sequence at locations of said memory means indicated by a first interleaving scheme,
   c) a second processing unit adapted to:
   convert output bit positions into input bit positions according to an inverse of a second interleaving scheme,
   read out bits being stored at locations of said memory means corresponding to said input bit positions, thereby generating an interleaved sequence which is interleaved according to said first and said second interleaving schemes, and
   process said interleaved sequence to convert bit positions and to process said interleaved sequence in overlapping periods of time.

14. The apparatus according to claim 13, wherein the second processing unit is adapted to convert bit positions and to process said interleaved sequence in the same period of time.

15. The apparatus according to claim 13 adapted to convert bit positions and to store the bits of said input bit sequence in overlapping periods of time.

16. The apparatus according to claim 13 adapted to beginning reading operations following completion of the storing operations.

17. The apparatus according to claim 13, wherein said further physical processing steps include a step of modulation.

18. The apparatus according to claim 13, wherein said further physical processing steps include a step of spreading.

19. An apparatus for processing an input bit sequence in a digital communication system, including:
   a) a memory means capable of storing said input bit sequence,
   b) a first processing unit adapted to store the bits of said input bit sequence in said memory means, and
   c) a second processing unit adapted to:
   convert output bit positions into input bit positions according to an inverse of a sequential application of a first interleaving scheme and a second interleaving scheme,
   read out bits stored at locations of said memory means corresponding to said input bit positions, thereby generating an interleaved sequence which is interleaved according to said first and said second interleaving schemes,
   process said interleaved sequence to convert bit positions and to process said interleaved sequence in overlapping periods of time.

20. The apparatus according to claim 19 wherein the second processing unit is adapted to convert bit positions and to process said interleaved sequence in the same period of time.

21. The apparatus according to claim 19 adapted to convert bit positions and to store the bits of said input bit sequence in overlapping periods of time.

22. The apparatus according to claim 19 adapted to begin reading operations upon completion of the storing operations.

23. The apparatus according to claim 19, wherein said further physical processing steps include a step of modulation.

24. The apparatus according to claim 19, wherein said further physical processing steps include a step of spreading.

* * * * *

UNITED STATES PATENT AND TRADEMARK OFFICE
CERTIFICATE OF CORRECTION

PATENT NO. : 7,269,149 B2
APPLICATION NO. : 10/528604
DATED : September 11, 2007
INVENTOR(S) : Kukla et al.

It is certified that error appears in the above-identified patent and that said Letters Patent is hereby corrected as shown below:

On the Title Page, item (75), under "Inventors", in Column 1, Line 1, delete "Herddsberg" and insert -- Heroldsberg --, therefor.

In Column 3, Line 33, delete "Similary" and insert -- Similarly --, therefor.

In Column 3, Line 35, delete "frist" and insert -- first --, therefor.

In Column 14, Line 37, in Claim 16, delete "beginning" and insert -- begin --, therefor.

In Column 14, Line 62, in Claim 19, delete "schemes," and insert -- scheme --, therefor.

In Column 14, Line 66, in Claim 20, after "claim 19" insert -- , --.

Signed and Sealed this

Twenty-second Day of July, 2008

JON W. DUDAS
*Director of the United States Patent and Trademark Office*